United States Patent [19]

Hashizume et al.

[11] Patent Number: 4,953,498

[45] Date of Patent: Sep. 4, 1990

[54] MICROWAVE PLASMA CVD APPARATUS HAVING SUBSTRATE SHIELDING MEMBER

[75] Inventors: Junichiro Hashizume, Ueno; Tetsuya Takei; Shigehira Iida, both of Kaya; Keishi Saitoh, Nabari; Takayoshi Arai, Ueno, all of Japan

[73] Assignee: Canon Kabushiki Kaisha, Tokyo, Japan

[21] Appl. No.: 477,123

[22] Filed: Feb. 7, 1990

Related U.S. Application Data

[63] Continuation of Ser. No. 403,990, Sep. 7, 1989, abandoned, which is a continuation of Ser. No. 173,606, Mar. 25, 1988, abandoned.

[30] Foreign Application Priority Data

Mar. 27, 1987 [JP] Japan .................................. 62-73562
Mar. 10, 1988 [JP] Japan .................................. 62-57297

[51] Int. Cl.$^5$ .............................................. C23C 16/50
[52] U.S. Cl. ..................................... 118/719; 118/723; 118/730
[58] Field of Search ......................... 118/719, 723, 730

[56] References Cited

U.S. PATENT DOCUMENTS 4,729,341 3/1988 Fournier ............................ 118/723
4,785,763 11/1988 Saitoh ................................ 118/723

Primary Examiner—Richard Bueker
Attorney, Agent, or Firm—Fitzpatrick, Cella, Harper & Scinto

[57] ABSTRACT

An improved MW-PCVD apparatus, characterized in that in the MW-CVD apparatus having a substrate onto which a deposited film to be formed and a space near the substrate for the decomposition of a raw material gas with the action of microwave energy, a shielding member is provided between said substrate and said space, which has an opening to allow part of the decomposed raw material gas species to be passed toward the substrate.

7 Claims, 9 Drawing Sheets

MICROWAVE PLASMA CVD APPARATUS HAVING SUBSTRATE SHIELDING MEMBER

This application is a continuation of application Ser. No. 07/403,990, filed Sept. 7, 1989 which is a continuation of application Ser. No. 07/173,606, filed Mar. 25, 1988, both now abandoned.

FIELD OF THE INVENTION

This invention relates to an improved microwave plasma CVD apparatus for the formation of a deposited film on a substrate, particularly a functional film, or more particularly, an amorphous semiconductor film usable as an constituent element member in semiconductor devices, electrophotographic sensitive devices, image input line sensors, image pickup devices and photoelectromotive force devices.

BACKGROUND OF THE INVENTION

Hitherto, as the element member of semiconductor device, photosensitive device for use in electrophotography, image input line sensor, image pickup device, photoelectromotive force device or other various electronic elements and optical elements, there have been proposed a number of amorphous semiconductor films, for instance, an amorphous silicon compensated with hydrogen or/and halogen (e.g., F, Cl)(hereinafter referred to as "A—Si(H,X)"). Some of such films have been put to practical use.

These deposited films have been known to be formed by plasma CVD method wherein a raw material gas is decomposed by subjecting it to the action of an energy of direct current, high frequency or microwave to thereby form a deposited film on a substrate of glass, quartz, heat-resistant synthetic resin, stainless steel or aluminum.

Now, in recent years, industrial attention has been focused on a microwave plasma CVD method (hereinafter referred to as "MW-PCVD method") using the microwave glow discharge decomposition.

One representative known apparatus for the formation of a deposited film by way of MW-PCVD method is such that has a structure as shown by a schematic perspective view of FIG. 10 and a schematic cross-section view of the apparatus of FIG. 10 as shown in FIG. 11.

In FIGS. 10 and 11, 1001 is a reaction chamber having a vacuum enclosed structure. 1002 is a dielectric window made of such material as quartz glass, alumina ceramics, that can transmit efficiently the microwave power into the reaction chamber and can retain the vacuum. 1003 is a microwave guide, and comprises mainly a metallic square waveguide. The waveguide is connected through a matching box and an isolator to a microwave power source (not shown). 1004 is an exhaust pipe that one end is open into the reaction chamber 1001 and the other end is connected to an exhaust apparatus (not shown). 1005 is a substrate on which a deposited film is to be formed. 1006 is a discharge space surrounded by substrates.

The formation of a deposited film using this conventional MW-PCVD apparatus is carried out in the following way. That is, the reaction chamber 1004 is evacuated by operating a vacuum pump (not shown) through the exhaust pipe 1004 to adjust the inside of the reaction chamber to a vacuum of $1 \times 10^{-7}$ Torr or less. Then, a heater 1007 is actuated to heat the substrate 1005 with a desired temperature suitable for the formation of a deposited film, and the substrate is kept at this temperature. Thereafter, for example, in the case of forming an amorphous silicon deposited film, silane gas, hydrogen gas and like raw material gas are introduced through a gas introducing means (not shown) into the reaction chamber. Simultaneously, a microwave with frequency of 500 MHz, preferably 2.45 GHz is generated by the microwave power source (not shown), and is introduced through the waveguide 1003 and the dielectric window 1002 into the reaction chamber 1001. Thus, the gas in the reaction chamber 1001 is activated and dissociated to form a deposited film on the surface of the substrate. At this time, the substrate 1005 is rotated in the direction of generatrix around the central axis to form a deposited film on the substrate.

That is, in the above film forming process, part of the surface of the substrate 1005 to become situated in the front region of the discharge space 1006 will be exposed to an atmosphere containing uniformly distributed plasmas and because of this, a film will be uniformly deposited thereon (this film will be hereinafter called "front film"). On the other hand, other parts of the surface of the substrate 1005 to become situated in the side regions of the discharging space 1006 will be exposed to an atmospheres containing unevenly distributed plasmas, so that films to be deposited on such other parts of the surface of the substrate will become uneven accordingly (these films will be hereinafter called "side part films"). The remaining part of the surface of the substrate 1005 to become situated in the non-discharging back region will not be exposed to plasma, so that said part will be maintained without being deposited with any film in said region.

In this respect, the resulting films will often become such that have defects in uniformity and also in homogeneity and that are not satisfactory in characteristics required for the light receiving layer of a photosensitive device, for example.

Therefore, there still remains an unsolved problem for the above-mentioned known MW-PCVD apparatus that it is difficult to stably obtain a desired film suited for use as a constituent layer in semiconductor devices, photosensitive devices for use in electrophotography, image input line sensors, image pickup devices, photoelectromotive force devices or the like.

In particular, there is a problem for the above-mentioned known MW-PCVD apparatus in the case of mass-producing a large size electrophotographic photosensitive member having a light receiving layer of large area that it is extremely difficult to stably obtain a desired large size electrophotographic photosensitive member of uniform quality with a high yield.

SUMMARY OF THE INVENTION

The present inventors have conducted extensive studies in order to solve the problems in the aforementioned known MW-PCVD apparatus and in order to make appropriate improvements therefor so as to make it possible to effectively form a widely usable functional deposited film having a wealth of many practically applicable characteristics without such problems as found on the known MW-PCVD apparatus.

As a result, the present inventors have found the facts which will be later mentioned and based on such findings developed an improved MW-PCVD apparatus that enables efficient and stable formation of a desired functional deposited film which is widely usable as a semiconductor element in electrophotographic photosensitive member, thin-film transistor, photosensor, solar cell and the like.

It is therefore an object of this invention to provide an improved MW-PCVD apparatus which enables to effectively and stably mass-produce a functional deposited film such as a semiconductor material film which excels in optical and electric characteristics and which is widely usable as a semiconductor element in the foregoing various devices.

Another object of this invention is to provide an improved MW-PCVD apparatus which enables to effectively and stably mass-produce a functional deposited amorphous film such as an amorphous semiconductor material film which excels in optical and electric characteristics and which is widely usable as a semiconductor element in the foregoing various devices at high deposition rate without generation of polysilane powder caused by polymerization of a raw material gas.

A further object of this invention is to provide an improved MW-PCVD apparatus which makes essentially or substantially hundred percent of the raw material gas to be utilized in the formation of the aforesaid functional deposited amorphous film at high deposition rate and which makes it possible to mass-produce said film on an industrial scale thereby enabling low cost production.

DESCRIPTION OF THE INVENTION

The present invention is to accomplish said objects, and it provides an improved MW-PCVD apparatus, characterized in that in the MW-CVD apparatus having a substrate onto which a deposited film to be formed and a space near the substrate for the decomposition of a raw material gas with the action of microwave energy, a shielding member is provided between said substrate and said space, which has an opening to allow part of the decomposed raw material gas species to be passed toward the substrate.

Figure 1:
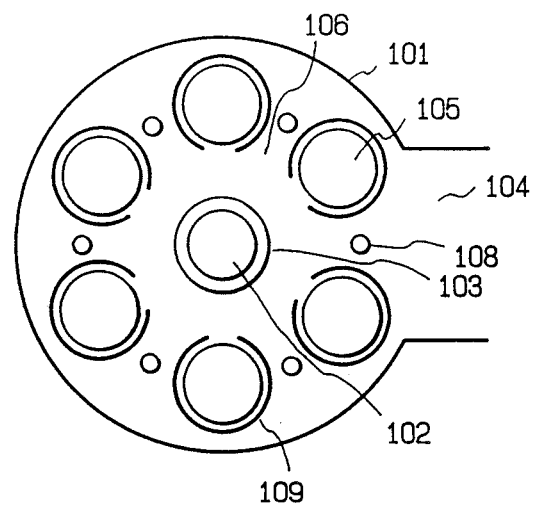
FIG. 1 is a schematic explanatory plan view, partly broken away, of a first representative MW-PCVD apparatus according to the present invention.
Figure 2:
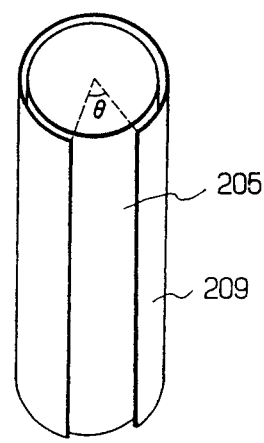
FIG. 2 is a schematic explanatory exploded view of a shielding member to be installed in the MW-PCVD apparatus shown in FIG. 1.
Figure 3:
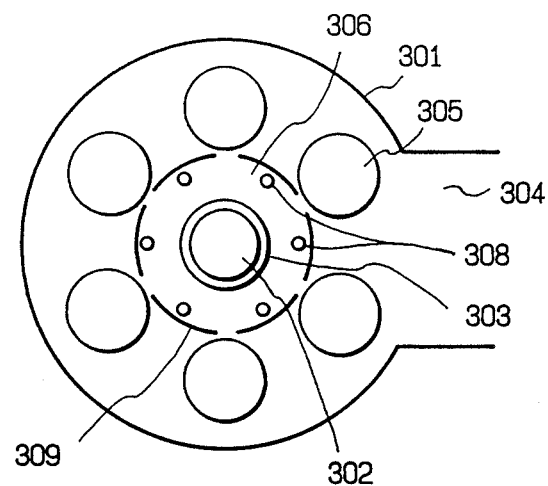
FIG. 3 is a schematic explanatory plan view, partly broken away, of a second representative MW-PCVD apparatus according to the present invention.
Figure 4:
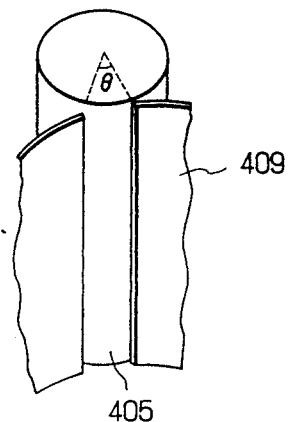
FIG. 4 is a schematic explanatory exploded view of a shielding member to be installed in the MW-PCVD apparatus shown in FIG. 3.
Figure 10:
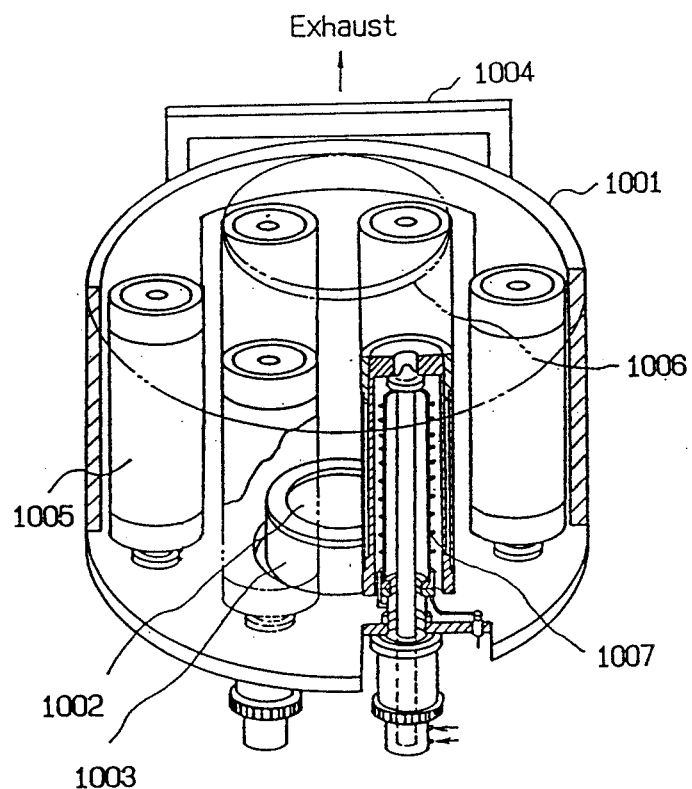
FIG. 10 is a schematic explanatory perspective view, partly broken away, of the known MW-PCVD apparatus.
Figure 11:
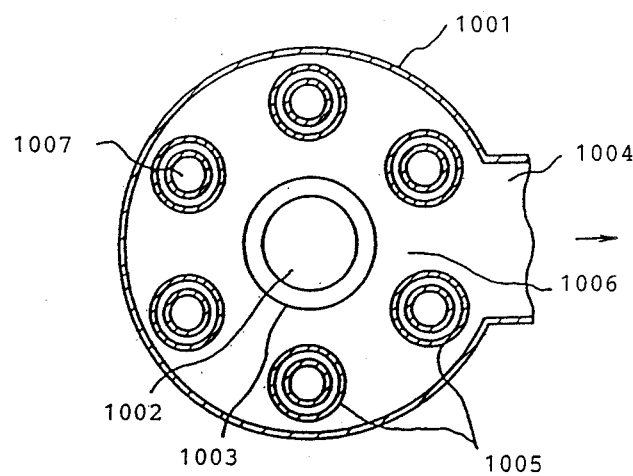
FIG. 11 is a schematic cross-sectional view, partly broken away, of the MW-PCVD apparatus of FIG. 10.

In FIGS. 1 and 2, there is shown a representative embodiment (1) of the MW-CVD apparatus which attains the objects of the present invention. In FIG. 1, there is shown a reaction chamber 101 which is provided with a microwave transmissive window 102. In the reaction space of the reaction chamber, there are arranged a plurality of cylindrical substrates 105 so that they surround the plasma space to receive the plasma substantially from one direction at their side surfaces. As long as the descriptions given above are concerned, the structure of the MW-PCVD apparatus is the same with the conventional MW-PCVD apparatus shown in FIG. 10. The point to distinguish the MW-PCVD apparatus of the present invention from the conventional one resides in that shielding members 109 shown in FIG. 1 are provided. The shielding member according to the present invention, concretely, has such shape as shown by the numeral 209 in FIG. 2. In FIGS. 3 and 4, there is shown a second embodiment (2) exerting similar effect. Here, the more the angle $\theta$ obtained when the opening is observed from the cylindrical substrate central axis (hereinafter referred to "open angle $\theta$") is increased, the more the area to be deposited with a film on the substrate is increased. And, the utilization efficiency of the raw material gas is increased. However, on the contrary to this, the cases when the film deposition occurs on the side surfaces of the substrate will be increased, and this results in reduction of the film quality. In return, when the open angle is reduced, the film quality is increased, but the utilization efficiency of the raw material gas is decreased. Considering these situations, the present inventors have experimentally found the fact that the open angle $\theta$ is desired to be adjusted to preferably from 20° to 90°, and more preferably, from 40° to 90°.

As the material for the shielding member, there may be illustrated metallic materials such as Al, Ni and stainless steel. Among these materials, Al is most desired, since Al hardly becomes to cause contamination for a deposited film such as A—Si:H:X film and its thermal expansion coefficient is equal each other when Al is also used as the substrate. Other than this, using Ni and stainless-steel which are of a high mechanical strength, the thickness of the shielding member can be reduced. Further, ceramics material and heat-resistant polymer such as polyimide are also suitable as well as the metallic material. The ceramics material is excellent in strength and heat-resistance, and polymer is excellent in workability.

The shielding member according to the present invention exerts particularly excellent effects when the inner pressure in the plasma space is a vacuum of 10 mTorr or less. At this inner pressure, the mean free path of the gas molecule ranges from several cm to several tens cm, and their collisions with the wall face of the shielding member occurs at higher rate than the collisions among the molecules. Similar thinking can also be given as for the active species contributing to the deposition of a film, and atoms move straightly not by diffusion. Accordingly, even if a certain space is present between the shielding member and the substrate, the atoms do not spread out through such space by diffusion, and they may be effective shielded.

The space between the shielding member and the substrate is the better the narrower. However, if it is too narrow, the evacuation of the air in the space between the shielding member and the substrate cannot be sufficiently carried out, and accordingly, a standing gas is liable to be generated. If such standing gas is present, the inner pressure of said space becomes higher than that as desired, and because of this, the effect to provide the shielding member will be diminished. In addition, if the distance between the shielding member and the substrate is a value of 1 mm or less, there occurs a difficulty in handling in case of putting the substrate or taking out the deposited film product. In addition, in the case of the embodiments (1) and (2) where a cylindrical substrate is used, the film deposited on the edge of the shielding member is sometimes stripped off during the film forming process for a long period of time. However, when said distance is 1 mm or more, the stripped film falls naturally without affecting adversely onto the film being deposited the substrate. However, said distance is too broad as much as more than 50 mm, said distance becomes near the mean free path of the gas molecule, and as a result, the substrate will be influenced by their diffusions and satisfactory effect is not obtained.

Considering these points, the distance between the shielding member and the substrate is preferably between 1 mm and 50 mm, more preferably between 1 mm and 40 mm, and most preferably, between 1 mm and 30 mm.

The other point of the MW-PCVD apparatus according to the present invention to be distinguished from the conventional MW-PCVD apparatus is that there are arranged gas feed pipes 108 or 308 having a plurality of gas liberation holes to allow a raw material gas to be fed into the plasma discharge space 106 or 306 between every space between every two the cylindrical substrates 105 or 305 so as to surround the plasma discharge space 106 or 306 in the ways as shown in FIG. 1 or FIG. 3. In this case, the raw material gas to be fed will be uniformly dispersed in the plasma discharge space and as a result, plasmas will be uniformly generated therein.

In this respect, according to the MW-PCVD apparatus of the present invention, there is a further advantage in addition to the advantage to be brought about by the provision of the foregoing shielding member. And a desirable deposited film excelling in the film homogeneity and the characteristics may be effectively formed at a high deposition rate and a high raw material gas utilization efficiency.

In the foregoing, detailed description is done only for the case where the substrate is cylindrical, but the shape of the substrate is not restricted to this type, and any shaped of substrate can be used that is expected to exert the effects given above. For example, the foregoing shielding member can be used suitably other kind of MW-PCVD apparatus such as shown in FIG. 5.

Figure 5:
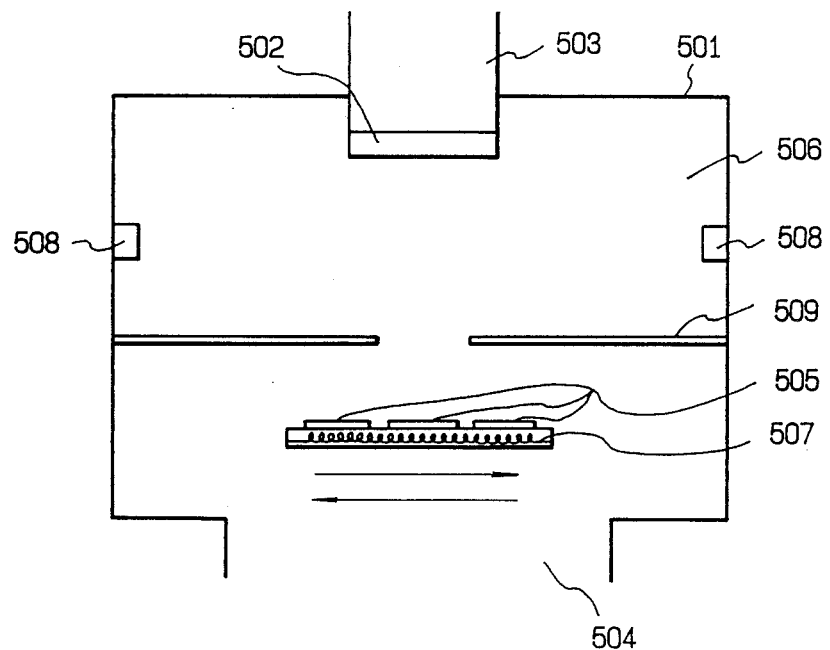
FIG. 5 is a schematic explanatory cross-sectional view, partly broken away, of a third representative MW-PCVD apparatus according to the present invention.

In FIG. 5, there are shown reaction chamber 501, microwave transmissive window 502, waveguide, 503, exhaust pipe 504, plate-like substrate 505, glow discharge plasma space 506, electric heater 507 for the substrate, gas feed pipe 508, and shielding member 509.

The heater 507 for the substrate, installed with a plurality of plate-like substrates 505 moves reciprocally in the longitudinal direction.

The foregoing distance between the shielding member and the substrate and the open angle $\theta$ have been decided in accordance with the results of the tests 1–3 given below.

Test 1

Using MW-CVD apparatuses equipped with the shielding members of the embodiment (1) shown in FIGS. 1 and 2 and the embodiment (2) shown in FIGS. 3 and 4, there were prepared a plurality of photosensitive drum samples having an inhibition type structure under the conditions shown in Table 1. For the microwave power source, there was used an oscillator with the maximum power of 2 kW, 2.45 GHz, and as the exhaust pump, there was used a combination of a oil diffusion pump, a mechanical booster pump and a rotary pump. The thickness measurement on the resultant photosensitive drum samples prepared under these conditions was done using a commercially available eddy current type thickness measuring device (product of Kett Company). And the measurement of the electric potential thereon was done using a commercially available surface electrometer (product of TREC Company) installed on a commercially available Canon copier NP-7550 (product of CANON KABUSHIKI KAISHA).

Figure 6:
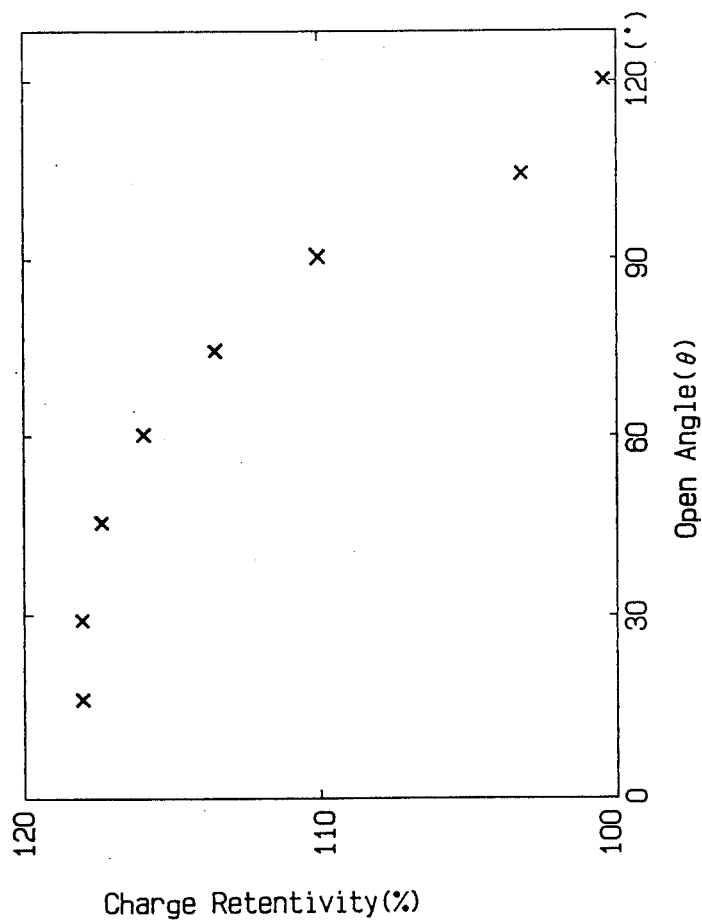
FIG. 6 is a graph illustrating the interrelations between opening degrees of the shielding member and charge retentivities of the resultant electrophotographic photosensitive members.

In FIG. 6, there are shown changes in the charge retentivity when the open angle of the shielding member was changed. The maximum of the charge retentivity of the drum sample which was prepared using the conventional MW-PCVD apparatus not having any shielding member shown in FIG. 10, was made as 100%. As a result, there was not observed any distinguishable difference in the effects between the embodiments 1 and 2 was not observed. And the charge retentivity was increased by about 20%, when the open angle was 15°, and this characteristic was maintained up to 45°.

The charge retentivity decreased slowly at 45° or more, however, the increase of more than 10% could be attained even at 90°. On the other hand, the charge retentivity decreased rapidly when the open angle was made 90° or more, and the effect due to the shielding member was not observed.

Figure 7:
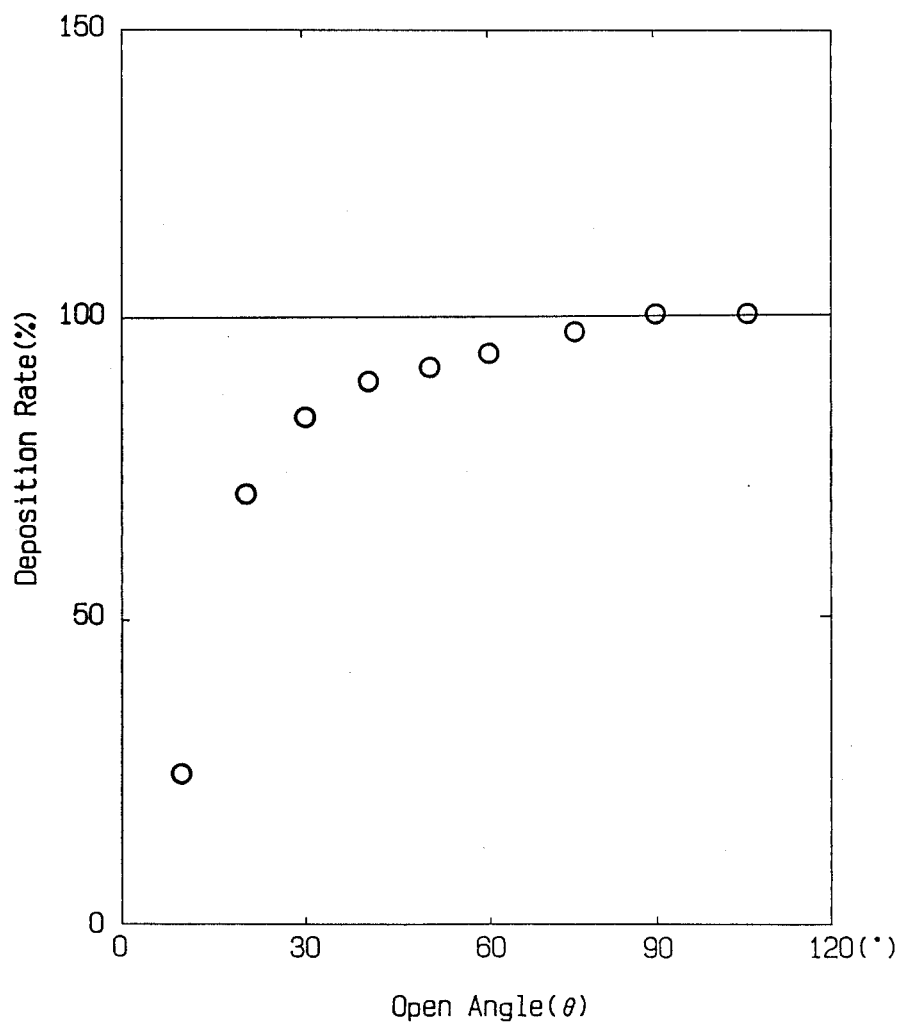
FIG. 7 is a graph illustrating the interrelations between opening degrees of the shielding member and deposition rates of the resultant deposited films.

FIG. 7 relates to the interrelation between the open angle and the deposition rate. The vertical axis shows the deposition rate, and the deposition rate in the case when the shielding member was not used, was made as 100%. The deposition rate became 70% or more at the open angle of 20° or more, and became 90% or more at 40° or more. The deposition rate decreased remarkably at 20° or less. So, the practical open angle is desired to be 20° or more, preferably 40° or more. From the above results, it is understood that the suitable open angle is 20° to 90°.

Test 2

The procedures of Test 1 were repeated, except that the distance between the shielding member and the substrate was changed, to thereby prepare a plurality photosensitive drum samples. The resultant drum samples were evaluated by repeating the evaluation procedures of Test 1.

Figure 8:
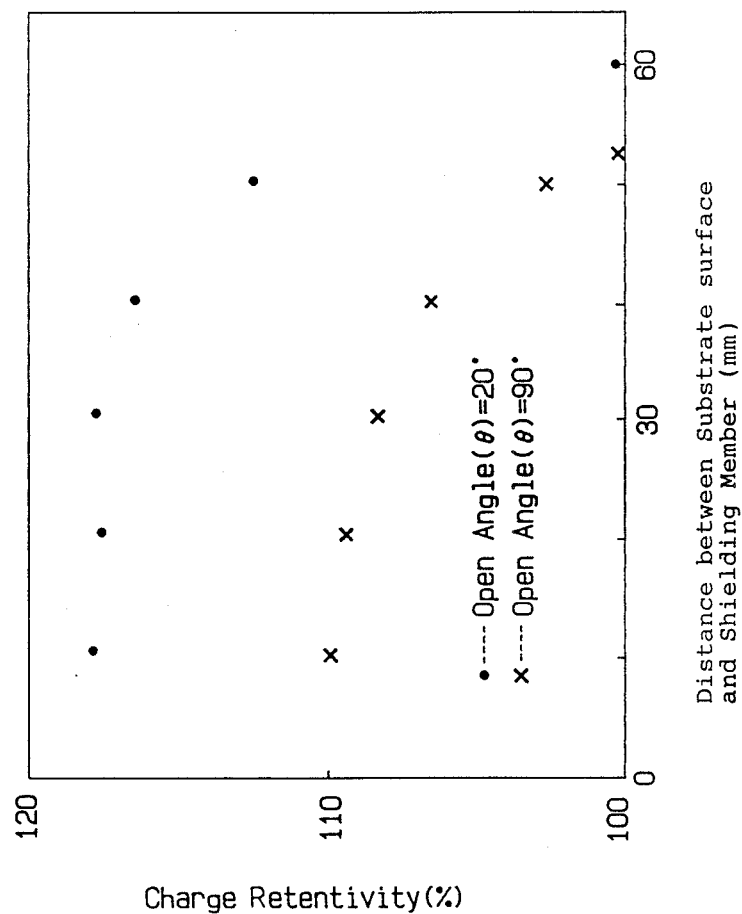
FIG. 8 is a graph illustrating the interrelations of distances between substrate surface and the shielding member to charge retentivities of the resultant electrophotographic photosensitive members.

In FIG. 8, there were shown changes in the charge retentivity in the case when said distance was changed.

There was not observed any distinguishable difference in the effects between the embodiments 1 and 2. And the charge retentivity changed scarcely in both cases when the open angle was made 20° and 90°, as long as the distance between the substrate and the shielding member was kept 30 mm or less. And, it decreased slowly at the distance of 30 to 50 mm. Then, it decreased remarkably when the distance exceeded 50 mm, and the effect due to the shielding member was not deserved.

From the above results, it is understood that the suitable distance between the substrate and the shielding member is preferably from 1 mm to 50 mm, more preferably from 1 mm to 40 mm, and most preferably, from 1 mm to 30 mm.

Test 3

Figure 9:
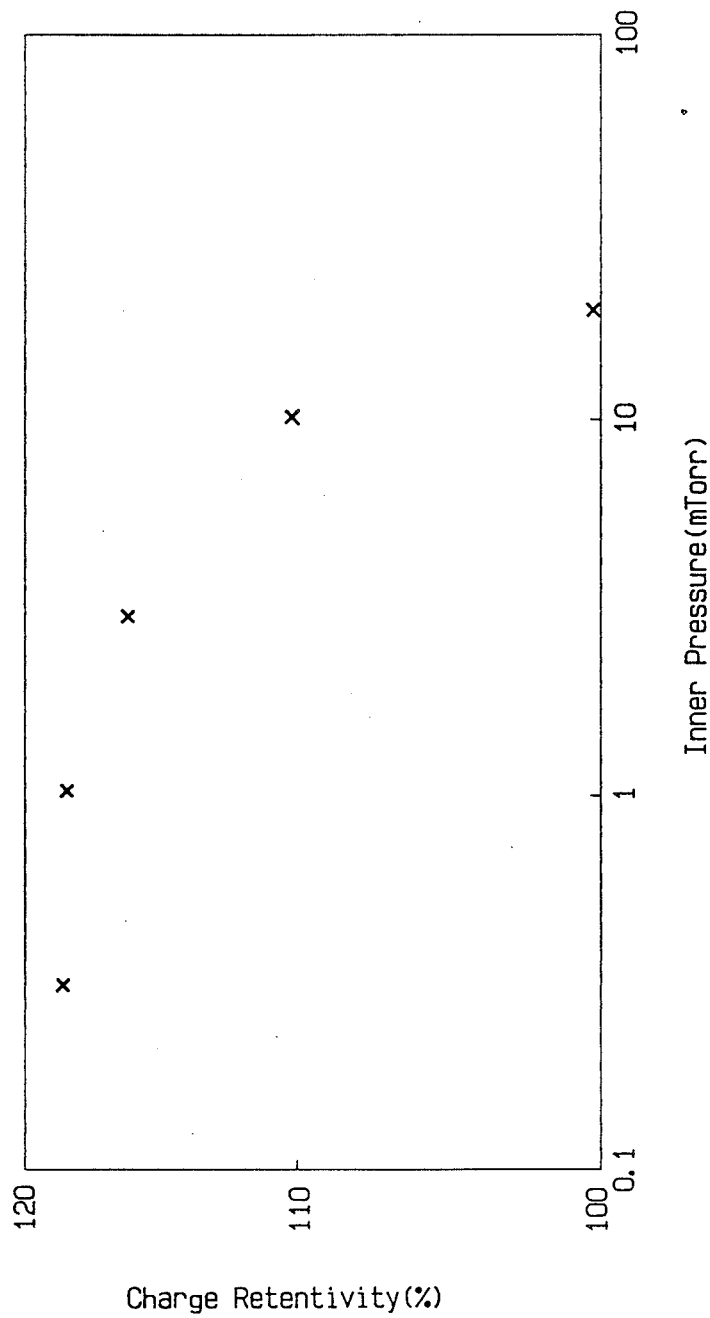
FIG. 9 is a graph illustrating the interrelations between inner pressures of the plasma discharge space and charge retentivities of the resultant electrophotographic photosensitive members.

The procedures of Test 1 were repeated, except that the inner pressure was changed, to thereby prepare a plurality of photosensitive drum samples. The resultant photosensitive drum samples were evaluated by repeating the evaluation procedures of Test 1. The results obtained were as shown in FIG. 9. There was not observed any distinguishable difference in the effects between the embodiments 1 and 2 was not observed. The effect due to the shielding member was observed particularly at an inner pressure of 10 m Torr or less, and the charge retentivity increased.

The advantages of this invention are now described in more detail by reference to the following Examples which are provided here for illustrative purposes only, and are not intended to limit the scope of this invention. In Examples 1 to 7, there was used the MW-PCVD apparatus of the embodiment (1) shown in FIGS. 1 and 2, and in Example 8, there was used the MW-PCVD apparatus shown in FIG. 5.

EXAMPLE 1

The inside of the reaction chamber 101 was evacuated through the exhaust pipe 104, and the heaters installed in the substrates 105 were actuated to heat the substrates to a desired temperature, and it was kept at this temperature. Then, silane gas (SiH$_4$). hydrogen gas (H$_2$) and diborane gas (B$_2$H$_6$) were supplied into the reaction chamber 101 through the gas feed pipes under the conditions shown in Table 2 while keeping the vacuum of the reaction chamber at $1 \times 10^{-2}$ Torr or less. The substrates 105 were rotated at a constant speed with a driving motor (not shown). Then, microwave of 2.45 GHz was applied from a microwave power source (not shown) into the discharge space 106 through the wave guides 103 and the microwave transmissive windows 102.

The raw material gases as introduced into the discharge space 106 were activated and dissociated to generate neutral radical particles, ion particles and electrons, and these were reacted each other to form a deposited film on the substrates 105 facing to the discharge space.

At this time the kind of the raw material gas, its flow rate, the inner pressure in the reaction chamber 101, the microwave energy to be introduced, etc. may be varied sensitive member to be prepared.

The resultant photosensitive members were evaluated on their characteristics (charge retentivity, sensitivity, residual potential), image characteristics (smeared image, ghost, defective image) using a Canon's experimental copier of NP-7550, (product of CANON KABUSHIKI KAISHA). The results obtained were as shown in Table 3.

[COMPARATIVE EXAMPLE]

For comparison, the procedures of Example 1 were repeated except that the shielding members were removed from the apparatus, to thereby prepare a plurality photosensitive member samples. The resultant samples were evaluated by repeating the evaluation procedures of Example 1. The results obtained were as shown in Table 3.

EXAMPLE 2

The procedures of Example 1 were repeated, except that the distance between the shielding member and the substrate, and the open angle ($\theta$) were changed, to thereby prepare a plurality of photosensitive members. In each case, the film forming period was adjusted in such a manner that the thickness of each layer was equal to that in Example 1. The resultant samples were evaluated by repeating the evaluation procedures of Example 1. The sample numbers and the film formation conditions are shown in Table 4. The evaluated results were as shown in Table 5.

EXAMPLE 3

The procedures of Example 1 were repeated, except that the inner pressure was changed, to thereby prepare a plurality of photosensitive member samples. The sample Nos. and the film forming conditions are shown in Table 6. The resultant samples were evaluated by repeating the evaluation procedures of Example 1. The evaluation results were as shown in Table 7.

EXAMPLE 4

The procedures of Example 1 were repeated except that the H$_2$ gas was replaced for Ar gas, to thereby prepare a photosensitive member. As a result of evaluating the resultant sample, there were obtained the results as shown in Table 8.

EXAMPLE 5

The procedures of Example 1 were repeated, except that H$_2$=500 SCCM was replaced for SiF$_4$=50 SCCM, to thereby prepare a photosensitive member. Its evaluation results were as shown in Table 8.

EXAMPLE 6

The procedures of Example 5 were repeated, except that the SiF$_4$ gas was replaced for Si$_2$F$_6$ gas, to thereby prepare a photosensitive member. Its evaluation results were as shown in Table 8.

EXAMPLE 7

The procedures of Example 1 were repeated, except that the flow rate of the SiH$_4$ gas was decreased to 450 SCCM, and GeH$_4$ gas was fed at a flow rate of 50 SCCM at the time of forming the charge injection inhibiting layer, to thereby prepare a photosensitive member. Its evaluation results were as shown in Table 8.

EXAMPLE 8

In this example, using the MW-CVD apparatus shown in FIG. 5, and in a similar manner as that in Example 1, there was prepared a A—Si(H,X) film under the conditions shown in Table 9. As a result of evaluating the resultant film, it was found that the dark resistance increases, and the ratio of the conductivity to the dark conductivity (τp/τd) increases by one figure.

In this example, when a shutter capable of being freely opened and shut is installed at the opening of the shielding member, the shutter can be closed when the glow discharge is unstable due to matching adjustment, and as a result, the film formation becomes possible to effectively carry out under stable discharge conditions, and further improvements in the characteristics become possible. In addition, the shielding member having such shutter can be designed to be freely removal together with the substrate to thereby protect the substrate from suffering physical impacts and to make easy the transport of the substrate.

TABLE 1

| Film forming conditions | Constituent layer | | |
|---|---|---|---|
| | Charge injection inhibition layer | Photo-conductive layer | Surface layer |
| Gas used & its flow rate | | | |
| SiH$_4$ | 400 sccm | 400 sccm | 100 sccm |
| H$_2$ | 400 sccm | 400 sccm | 0 sccm |
| B$_2$H$_6$ | 2000 ppm (against SiH$_4$) | 0 ppm | 0 ppm |
| NO | 20 sccm | 0 sccm | 0 sccm |
| CH$_4$ | 0 sccm | 0 sccm | 500 sccm |
| Microwave power (2.45 GHz) | 0.7 kW | 1.5 kW | 1 kW |
| Deposition period | 10 min. | 50 min. | 3 min. |

TABLE 2

| Film forming conditions | Constituent layer | | |
|---|---|---|---|
| | Charge injection inhibition layer | Photo-conductive layer | Surface layer |
| Gas used & its flow rate | | | |
| SiH$_4$ | 500 sccm | 600 sccm | 100 sccm |
| H$_2$ | 500 sccm | 500 sccm | 0 sccm |
| B$_2$H$_6$ | 2000 ppm (against SiH$_4$) | 0 ppm | 0 ppm |
| NO | 20 sccm | 0 sccm | 0 sccm |
| CH$_4$ | 0 sccm | 0 sccm | 500 sccm |
| Microwave power (2.45 GHz) | 0.7 kW | 1.5 kW | 1 kW |
| Deposition period | 10 min. | 50 min. | 3 min. |

Open angle of the shielding member (θ): 40°
Distance between shield member and substrate: 20 mm
Inner pressure: 2 mTorr

TABLE 3

| | Charge retentivity | Sensitivity | Residual potential | Smeared image | Ghost | Defective image |
|---|---|---|---|---|---|---|
| Example 1 | ◎ | ◎ | ◎ | ◎ | ◎ | ○ |
| Comparative example | Δ | Δ | Δ | Δ | Δ | ○ |

◎: Excellent
○: Good
Δ: Practically applicable
×: Practically not applicable

TABLE 4

| | d (mm) | | | | | | |
|---|---|---|---|---|---|---|---|
| θ (degree) | 0.5 | 1 | 10 | 30 | 40 | 50 | 60 |
| 10 | 2-1 | 2-2 | 2-3 | 2-4 | 2-5 | 2-6 | 2-7 |
| 20 | 2-8 | 2-9 | 2-10 | 2-11 | 2-12 | 2-13 | 2-14 |
| 40 | 2-15 | 2-16 | 2-17 | 2-18 | 2-19 | 2-20 | 2-21 |
| 60 | 2-22 | 2-23 | 2-24 | 2-25 | 2-26 | 2-27 | 2-28 |
| 90 | 2-29 | 2-30 | 2-31 | 2-32 | 2-33 | 2-34 | 2-35 |
| 105 | 2-36 | 2-37 | 2-38 | 2-39 | 2-40 | 2-41 | 2-42 | d: Distance between shield member and substrate.
θ: Open angle of the shielding member.

TABLE 5

| Sample No. | Charge retentivity | Sensitivity | Residual potential | Smeared image | Ghost | Defective image | Deposition rate (Å/sec) | Total evaluation |
|---|---|---|---|---|---|---|---|---|
| 2-1 | Δ | Δ | ○ | ○ | ○ | × | × | × |
| 2-2 | ◎ | ◎ | ◎ | ◎ | ◎ | ○ | × | × |
| 2-3 | ◎ | ◎ | ◎ | ◎ | ◎ | ○ | × | × |
| 2-4 | ◎ | ◎ | ◎ | ◎ | ◎ | ○ | × | × |
| 2-5 | ◎ | ◎ | ○ | ○ | ○ | ○ | × | × |
| 2-6 | ○ | ○ | ○ | ○ | ○ | ○ | × | × |
| 2-7 | Δ | Δ | Δ | Δ | Δ | ○ | × | × |
| 2-8 | Δ | Δ | ○ | ○ | ○ | × | Δ | × |
| 2-9 | ◎ | ◎ | ◎ | ○ | ○ | ○ | Δ | ○ |
| 2-10 | ◎ | ◎ | ◎ | ○ | ○ | ○ | Δ | ○ |
| 2-11 | ◎ | ◎ | ◎ | ○ | ○ | ○ | Δ | ○ |
| 2-12 | ◎ | ◎ | ○ | ○ | ○ | ○ | Δ | ○ |
| 2-13 | ○ | ○ | ○ | ○ | ○ | ○ | Δ | ○ |
| 2-14 | Δ | Δ | Δ | Δ | Δ | ○ | Δ | Δ |
| 2-15 | Δ | Δ | ○ | ○ | ○ | × | ○ | × |
| 2-16 | ◎ | ◎ | ◎ | ◎ | ◎ | ○ | ○ | ◎ |
| 2-17 | ◎ | ◎ | ◎ | ◎ | ◎ | ○ | ○ | ◎ |
| 2-18 | ◎ | ◎ | ◎ | ◎ | ◎ | ○ | ○ | ◎ |
| 2-19 | ◎ | ◎ | ○ | ○ | ○ | ○ | ○ | ○ |
| 2-20 | ○ | ○ | ○ | ○ | ○ | ○ | ○ | ○ |
| 2-21 | Δ | Δ | Δ | Δ | Δ | ○ | ○ | Δ |
| 2-22 | Δ | Δ | ○ | ○ | ○ | × | ○ | × |
| 2-23 | ◎ | ◎ | ◎ | ◎ | ◎ | ○ | ○ | ◎ |

TABLE 5-continued

| Sample No. | Charge retentivity | Sensitivity | Residual potential | Smeared image | Ghost | Defective image | Deposition rate (Å/sec) | Total evaluation |
|---|---|---|---|---|---|---|---|---|
| 2-24 | ◉ | ◉ | ◉ | ◉ | ◉ | ○ | ○ | ◉ |
| 2-25 | ◉ | ◉ | ◉ | ◉ | ◉ | ○ | ○ | ◉ |
| 2-26 | ◉ | ◉ | ○ | ○ | ○ | ○ | ○ | ○ |
| 2-27 | ○ | ○ | ○ | ○ | ○ | ○ | ○ | ○ |
| 2-28 | △ | △ | △ | △ | △ | ○ | ○ | △ |
| 2-29 | △ | △ | ○ | ○ | ○ | × | ◉ | × |
| 2-30 | ◉ | ◉ | ◉ | ◉ | ◉ | ○ | ◉ | ◉ |
| 2-31 | ◉ | ◉ | ◉ | ◉ | ◉ | ○ | ◉ | ◉ |
| 2-32 | ◉ | ◉ | ◉ | ◉ | ◉ | ○ | ◉ | ◉ |
| 2-33 | ◉ | ◉ | ○ | ○ | ○ | ○ | ◉ | ○ |
| 2-34 | ○ | ○ | ○ | ○ | ○ | ○ | ○ | ○ |
| 2-35 | △ | △ | △ | △ | △ | ○ | ◉ | △ |
| 2-36 | △ | △ | △ | △ | △ | × | ◉ | × |
| 2-37 | △ | △ | △ | △ | △ | ○ | ◉ | △ |
| 2-38 | △ | △ | △ | △ | △ | ○ | ◉ | △ |
| 2-39 | △ | △ | △ | △ | △ | ○ | ◉ | △ |
| 2-40 | △ | △ | △ | △ | △ | ○ | ◉ | △ |
| 2-41 | △ | △ | △ | △ | △ | ○ | ◉ | △ |
| 2-42 | △ | △ | △ | △ | △ | ○ | ◉ | △ |

◉: Excellent
○: Good
△: Practically applicable
×: Practically not applicable

TABLE 6

| Inner pressure (mTorr) | 0.3 | 1 | 3 | 10 | 20 |
|---|---|---|---|---|---|
| Sample No. | 3-1 | 3-2 | 3-3 | 3-4 | 3-5 |

TABLE 7

| Sample No. | Charge retentivity | Sensitivity | Residual potential | Smeared image | Ghost | Defective image |
|---|---|---|---|---|---|---|
| 3-1 | ◉ | ◉ | ◉ | ◉ | ◉ | ○ |
| 3-2 | ◉ | ◉ | ◉ | ◉ | ◉ | ○ |
| 3-3 | ◉ | ◉ | ◉ | ◉ | ◉ | ○ |
| 3-4 | ○ | ○ | ○ | ○ | ○ | ○ |
| 3-5 | △ | △ | ○ | ○ | △ | ○ |

◉: Excellent
○: Good
△: Practically applicable
×: Practically not applicable

TABLE 8

| | Charge retentivity | Sensitivity | Residual potential | Smeared image | Ghost | Defective image |
|---|---|---|---|---|---|---|
| Example No. 4 | ◉ | ◉ | ◉ | ◉ | ◉ | ○ |
| Example No. 5 | ○ | ◉ | ◉ | ◉ | ◉ | ○ |
| Example No. 6 | ○ | ◉ | ◉ | ◉ | ◉ | ○ |
| Example No. 7 | ◉ | ◉ | ◉ | ◉ | ◉ | ○ |

◉: Excellent
○: Good
△: Practically applicable
×: Practically not applicable

TABLE 9

| Film forming conditions | Photoconductive layer |
|---|---|
| Gas used & its flow rate | |
| $SiH_4$ | 400 sccm |
| $H_2$ | 400 sccm |
| Microwave power (2.45 GHz) | 1.5 kW |
| Deposition period | 10 min. |

What we claim is:

1. In an apparatus for the formation of a functional deposited film on a plurality of cylindrical substrates by means of microwave plasma chemical vapor deposition, said apparatus having a cylindrical deposition chamber with a center longitudinal axis and comprising a circumferential wall having an end portion thereof provided with a microwave introducing window to which a waveguide extending from a microwave power source is connected, said cylindrical deposition chamber having a plasma generation space and plurality of rotatable cylindrical substrate holders therein, each of said substrate holders capable of having one of said cylindrical substrates positioned thereon, said rotatable cylindrical substrate holders being concentrically arranged in said cylindrical deposition chamber substantially parallel and equidistant from said center longitudinal axis of said deposition chamber, said cylindrical deposition chamber being provided with means for supplying a film-forming raw material gas into said plasma generation space and means for evacuating said cylindrical disposition chamber, the improvement with comprises a cylindrically shaped shielding member made of a material selected from the group consisting of aluminum, nickel, stainless steel, ceramics, and heat-resistant polymer, said shielding member positioned so as to be adjacent to each of said cylindrical substrates while maintaining a constant distance between said shielding member and each of said cylindrical substrates in said plasma generation space, said shielding member being provided with a plurality of openings, each of said openings being directed to one of said cylindrical substrates and each of said openings being longitudinally situated along one of said cylindrical substrates so as to allow active species capable of contributing to the formation of a deposited film generated in said plasma generation space to pass through said openings toward the cylindrical substrate.

2. The apparatus according to claim 1 wherein said distance between said shielding member and said at least one cylindrical substrate is from 1 to 50 mm.

3. The apparatus of claim 1 further including a first terminal end of said at least one opening of said shielding member and a second opposed terminal end of said at least one opening of said shielding member, said first and second terminal ends being arranged to form an angle $\theta$ inscribed between a first radius extending from said first terminal end to a center longitudinal axis of said at least one cylindrical substrate and an second radius extending from said second terminal end to said center longitudinal axis of said at least one cylindrical substrate, wherein said angle $\theta$ is from 20° to 90°.

4. The apparatus according to claim 1, wherein said shielding member comprises a plurality of shielding plates made of material selected from the group consisting of aluminum nickel, stainless steel, ceramics, and heat-resistant polymer, said plurality of shielding plates being concentrically arranged so as to form a longitudinal opening between each pair of the adjacent shielding members along one of said cylindrical substrates such that said active species pass through the opening toward the cylindrical substrate.

5. In an apparatus for the formation of a functional deposited film on a plurality of cylindrical substrates by means of microwave plasma chemical vapor deposition, said apparatus having a cylindrical deposition chamber with a center longitudinal axis and comprising a circumferential wall having an end portion thereof provided with a microwave introducing window to which a waveguide extending from a microwave power source is connected, said cylindrical deposition chamber having a plasma generation space and plurality of rotatable cylindrical substrate holders therein, each of said substrate holders capable of having one of said cylindrical substrates positioned thereon, said rotatable cylindrical substrate holders being concentrically arranged in said cylindrical deposition chamber substantially parallel and equidistant from said center longitudinal axis, said cylindrical deposition chamber being provided with means for supplying a film-forming raw material gas into said plasma generation space and means for evacuating said cylindrical deposition chamber, the improvement which comprises a plurality of cylindrically shaped shielding members made of a material selected from the group consisting of aluminum, nickel, stainless steel, ceramics and heat-resistant polymer, said each of shielding members positioned so as to be adjacent to each of said cylindrical substrates while maintaining a constant distance between said shielding member and said cylindrical substrate in said plasma generation space, each of said shielding members being provided with a plurality of openings said openings being directed to one of said cylindrical substrates and each of said openings being longitudinally situated along one of said cylindrical substrates so as to allow active species capable of contributing to the formation of a deposited film generated in said plasma generation space to pass through said openings toward the cylindrical substrate.

6. The apparatus according to claim 5, wherein said distance between said shield member of said cylindrical substrate is from 1 to 50 mm.

7. The apparatus according to claim 5, wherein said opening is made to have a apparent angle formed by the two terminal ends of the opening and the center axis of the cylindrical substrate when observed from the said center axis toward the apparent axis of said plasma generation space to be 20° to 90°.

* * * * *

UNITED STATES PATENT AND TRADEMARK OFFICE
CERTIFICATE OF CORRECTION

PATENT NO. : 4,953,498

DATED : September 4, 1990

INVENTOR(S) : JUNICHIRO HASHIZUME, ET AL.

It is certified that error appears in the above-identified patent and that said Letters Patent is hereby corrected as shown below:

On title page,

[30] FOREIGN APPLICATION PRIORITY DATA

"Mar. 10, 1988 [JP] Japan ......... 62-57297" should read
--Mar. 10, 1988 [JP] Japan ........ 63-57297--.

COLUMN 1

Line 15, "an" should read --a--.
Line 64, "chamber 1004" should read --chamber 1001--.

COLUMN 2

Line 26, "atmospheres" should read --atmosphere--.

COLUMN 4

Line 34, "referred to" should read --referred to as--.
Line 52, "equal" should read --equal to--.

COLUMN 5

Line 18, "putting" should read --putting in--.
Line 26, "deposited" should read --deposited on--.
Line 43, "two the" should read --two of the--.
Line 60, "shaped" should read --shape--.
Line 62, "suitably other" should read
    --suitably in another--.
Line 65, "waveguide, 503," should read --waveguide 503,--.

UNITED STATES PATENT AND TRADEMARK OFFICE
CERTIFICATE OF CORRECTION

PATENT NO. : 4,953,498

DATED : September 4, 1990

INVENTOR(S) : JUNICHIRO HASHIZUME, ET AL.

It is certified that error appears in the above-identified patent and that said Letters Patent is hereby corrected as shown below:

COLUMN 6

Line 2, "505 moves" should read --505, moves--.
    Line 18, "a oil" should read --an oil--.
    Line 38, "2 was not observed." should read --2.--.
    Line 63, "plurality" should read --plurality of--.

COLUMN 7

Line 10, "deserved." should read --observed.--.
    Line 25, "2 was not observed." should read --2.--.
    Line 57, "reacted each" should read --reacted with each--.
    Line 62, "varied" should read --varied arbitrarily depending on the desired structure of a photo- --.

COLUMN 8

Line 8, "ity" should read --ity of--.

COLUMN 9

Line 2, "($\tau$p/$\tau$d)" should read --($\sigma$p/$\sigma$d)--.
    Line 11, "removal" should read --movable--.

COLUMN 12

Line 44, "plurality" should read --a plurality--.

UNITED STATES PATENT AND TRADEMARK OFFICE
CERTIFICATE OF CORRECTION

PATENT NO. : 4,953,498

DATED : September 4, 1990

INVENTOR(S) : JUNICHIRO HASHIZUME, ET AL.

It is certified that error appears in the above-identified patent and that said Letters Patent is hereby corrected as shown below:

COLUMN 13

Line 2, "dispo-" should read --depo- --.
Line 3, "with" should read --which--.
Line 29, "an" should read --a--.
Line 36, "aluminum nickel," should read
--aluminum, nickel,--.

COLUMN 14

Line 22, "said each of" should read --each of said--.
Line 28, "openings said" should read --openings, said--.
Line 36, "shield member" should read --shielding member--.
Line 39, "a" should read --an--.

Signed and Sealed this

Twenty-second Day of March, 1994

Attest:

BRUCE LEHMAN

Attesting Officer

Commissioner of Patents and Trademarks